(12) United States Patent
MacNeil et al.

(10) Patent No.: US 6,627,535 B2
(45) Date of Patent: Sep. 30, 2003

(54) METHODS AND APPARATUS FOR FORMING A FILM ON A SUBSTRATE

(75) Inventors: John MacNeil, Cardiff (GB); Robert John Wilby, Nailsea (GB); Knut Beekman, Yatton (GB)

(73) Assignee: Trikon Holdings Ltd., Newport (GB)

( * ) Notice: Subject to any disclaimer, the term of this patent is extended or adjusted under 35 U.S.C. 154(b) by 120 days.

(21) Appl. No.: 09/760,820

(22) Filed: Jan. 17, 2001

(65) Prior Publication Data

US 2001/0030369 A1 Oct. 18, 2001

(30) Foreign Application Priority Data

Jan. 19, 2000 (GB) .............................. 0001179

(51) Int. Cl.[7] .................. H01L 21/4763; H01L 21/469
(52) U.S. Cl. .................. 438/634; 438/624; 438/778; 438/931
(58) Field of Search ................ 438/778, 791, 438/513, 624, 634, 931

(56) References Cited

U.S. PATENT DOCUMENTS

| 4,647,472 A | 3/1987 | Hiraki et al. |
| 5,225,032 A | * 7/1993 | Golecki ................... 156/612 |
| 5,244,698 A | 9/1993 | Ishihara et al. |
| 5,514,604 A | 5/1996 | Brown |
| 5,635,423 A | 6/1997 | Huang et al. |

FOREIGN PATENT DOCUMENTS

| EP | 1 059 664 A2 | 12/2000 |
| WO | WO 99/56310 | 4/1999 |
| WO | WO 99/33102 | 7/1999 |
| WO | WO 99/41423 | 8/1999 |
| WO | 99/41423 | * 8/1999 |
| WO | WO 00/19498 | 4/2000 |

* cited by examiner

Primary Examiner—Alexander Ghyka
(74) Attorney, Agent, or Firm—Volentine Francos, PLLC

(57) ABSTRACT

This invention relates semiconductor devices incorporating an intermediate etch stop layer between two dielectric layers in which the dielectric constant of each of the layers is $k \leq 3.5$ and the etch stop layer has a selectivity of at least 2.5:1 relative to the upper layer. Methods and apparatus for forming nitrogen doped silicon carbide films, for example, for use as etch stop layers are described.

9 Claims, 5 Drawing Sheets

METHODS AND APPARATUS FOR FORMING A FILM ON A SUBSTRATE

This invention relates to methods and apparatus for forming films on a substrate and in particular, but not exclusively, to forming low k etch stop films and devices containing such films. For the purposes of this specification the term low k refers to dielectric constants of 3.5 or less.

Damascene and dual damascene processing is becoming more prevalent in the manufacture of semiconductor wafers and in particular where copper is used as the interconnect metal. This is because the plasma etching of copper is relatively difficult and it is therefore preferred to etch formations in the dielectric layer and then deposit copper into the etched structure to fill it. Any excess copper can then be removed from the surface for example by chemical mechanical polishing leaving an inlay of copper in the etched features.

In dual damascene processing two separate but connected features are etched in respective dielectric layers one line above the other. Thus a trench may be cut in the upper layer and vias may be formed in the lower layer to connect the trench to contact points in an underlying layer. Examples of such structures are discussed in an article entitled Dual Damascene Challenges, Dielectric Etch by Peter Singer in the August 1999 edition of Semiconductor International.

A common approach to creating dual damascene features is to deposit an etch stop layer between the two layers of dielectric so that the etch stop layer gives a good "end point" signal to the automated etching equipment as breaks through the first layer. Such closed loop control is preferred because it enables more precise control of the etched features than an open loop timed etch.

The etch stop layer therefore tends to need to have a relatively high selectivity for the etch process relative to the upper layer so that it is etched significantly more slowly giving time for control to take place.

Commonly, these days, it is desirable that the whole dielectric structure has a low k value and this leads one to the desire to have an etch stop layer which also has a low k value.

Additionally a silane-based plasma-formed silicon nitride has been used as an etch stop layer in association with a silicon dioxide type layer, however such silicon nitride would usually have a k value of about 7.5 compared to a standard silicon dioxide k value of 4.1 and the perceived low k requirement that k is less than 3.5. Silicon carbide has been proposed as an alternative etch stop material but its k value is 9 to 10 and this still results in significant increases in the k value of the dielectric stack. Silicon nitride layers have also been found to be problematic in that they create a good water barrier and many low k processes rely on water being able to be forced out of the dielectric layer during processing.

Further, current silicon nitride technology is not necessarily compatible with the chemistry used to form the low k layers.

A discussion of these problems is contained in WO-A-99/41423, but the conclusion of that patent application is that a good etch stop layer for this situation should have a significant oxide content. A large number of proposed solutions are set out but they appear to require stacks of layers having significantly different k values.

From one aspect the invention consists in a semiconductor device including a dual damascene structure formed in a dielectric stack, the stack comprising an upper layer having first formation etched therein, an intermediate etch stop layer and a lower layer having a second formation etch therein, the second formation being contiguous with the first, each of the layers having a dielectric constant $k \leq 3.5$ and more preferably below 3.0 and the etch stop layer having a selectivity of at least 2.5:1 relative to the upper layer.

Preferably the etch stop layer is integral with the lower layer and it is particularly preferred that the etch stop layer is formed of nitrogen doped silicon carbide.

In a particularly preferred arrangement the k value of the etch stop layer is substantially equal to that of the other layers in the stack. Surprisingly, it has been found that the k value of the nitrogen doped silicon carbide can be adjusted depending on the amount of nitrogen doping which takes place. It is therefore, at least to an extent, possible to match the k value of the etch stop layer, with that of the other dielectric layers.

As has already been indicated above, that the etch stop layer may be integral with the lower layer, because the k value of the nitrogen doped silicon carbide is sufficiently low to be a low k dielectric material in its own right.

Thus from a second aspect the invention consists in a low k dielectric layer formed of nitrogen doped silicon carbide.

From a further aspect the invention consists in a method of forming a low k film on a substrate comprising:

(a) positioning the substrate on a support in a chamber; and
(b) supplying to the chamber, in gaseous or vapour form, a silicon-containing organic compound and nitrogen in the presence of a plasma to deposit a nitrogen doped silicon carbide film on the substrate.

The silicon containing organic compound may be an alkylsilane and more specifically it may be tetraalkylsilane. It is particularly preferred that the silicon containing organic compound is tetramethylsilane.

The film may be deposited on a substrate positioned at or below room temperature and RF power may be supplied during the deposition of the film.

Although the invention has been defined above it is to be understood it includes any inventive combination of the features set out above or in the following description.

BRIEF DESCRIPTION OF THE DRAWINGS

The invention may be performed in various ways and specific embodiments will now be described, by way of example, with reference to the following drawings in which;

Referring to FIG. 1, there is shown, generally indicated at 1, an apparatus which includes a vacuum chamber 2 having a showerhead 3 and a wafer support or platen 4. The showerhead 3 is connected to an RF source (not shown) to form one electrode, whilst the support 4 may be earthed to form another electrode. Alternatively, the RF source could be connected to the support 4 and the showerhead 3 earthed. The showerhead 3 is connected by pipes (nor shown) to respective sources of tetramethylsilane and another gas or gases. The apparatus is generally of the form disclosed in EP-A-0731982, which is incorporated herein by reference. However, a standard (non-duplex) showerhead is normally used.

Figure 1:
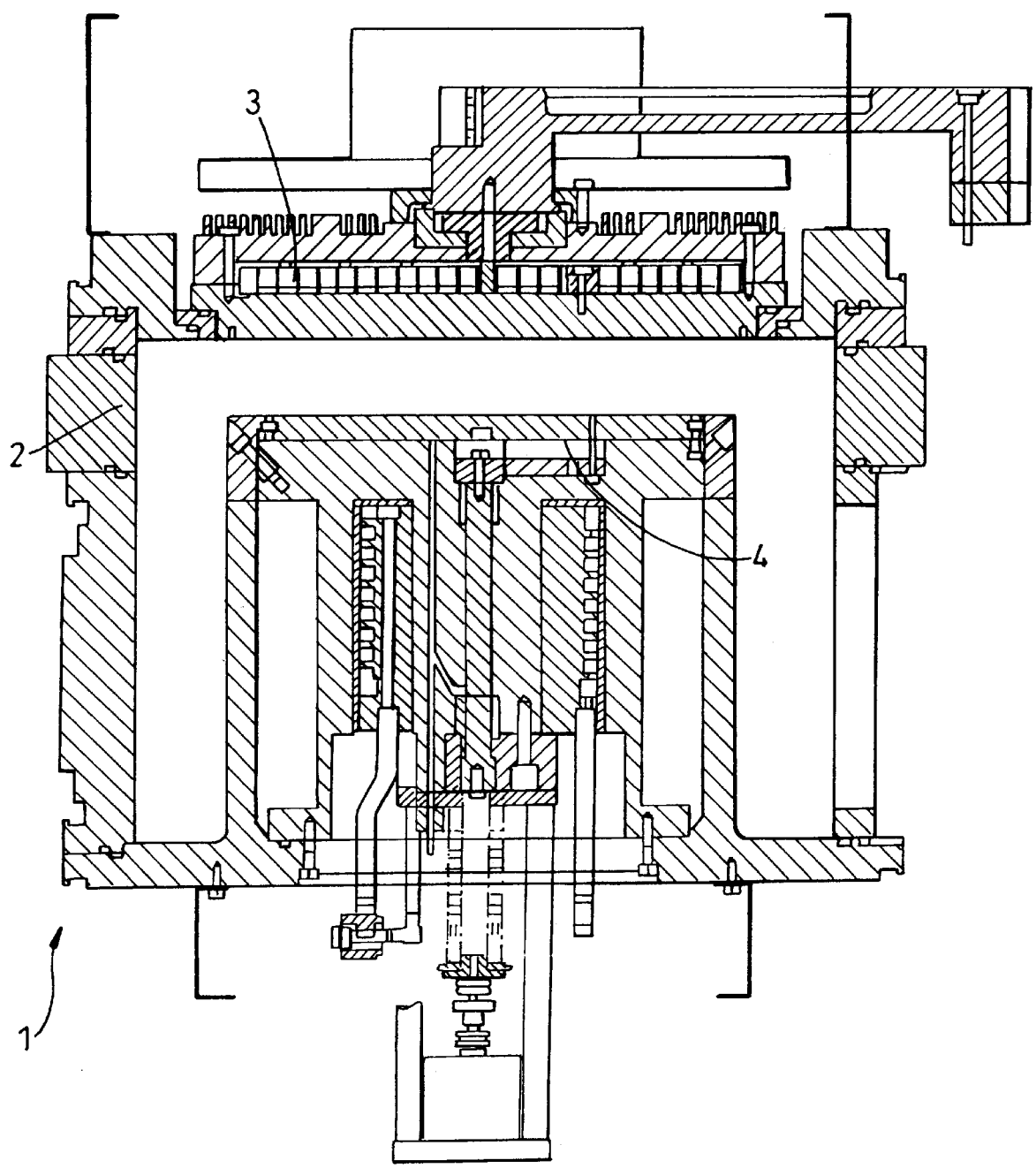
FIG. 1 is a schematic view of an apparatus for use in the present invention.

In use, the apparatus can in fact be arranged to deposit a variety of layers depending on the nature of the other gas supplied. Thus if the other gas is oxygen or an oxygen containing gas, then a low k carbon doped silicon dioxide layer can be formed. If on the other hand the other gas is nitrogen then depending on the flow rate of the nitrogen, anything from a pure silicon carbide layer (with virtually no nitrogen present) to a carbon doped silicon nitride layer (with a high nitrogen flow) can be formed. The applicants have discovered that by suitable adjustment of the nitrogen flow rate, nitrogen-doped silicon carbide films can be formed which have a k value similar to or equal to the carbon-doped silicon dioxide layer mentioned above. It is thus possible in a single chamber to form a dielectric stack consisting of carbon doped silicon dioxide layer, a nitrogen doped silicon carbide layer and a carbon doped silicon dioxide layer. The stack is therefore not only particularly desirable from a low k point of view, it can also be simply formed in a manner which allows high throughput.

Thus, in one experiment a particularly effective etch stop layer was developed by forming what may be considered as a methyl doped silicon carbide/nitride with a k value of approximately 2.6. It was found if the carbon to nitrogen ratio was reduced to form more of a carbon doped silicon nitride then the k value increased to approximately 4.6. There was no hard transition point between the two materials. Greater additions of nitrogen to the process gas increase the nitrogen to carbon ratio such that at one extreme (no nitrogen) material can be considered silicon carbide and at the other carbon containing silicon nitride. All films contained hydrogen.

In this experiment the process conditions were as follows:

| Pressure | TMS flow | O$_2$ Flow | N$_2$ Flow | RF Power | Temp |
|---|---|---|---|---|---|
| low-k C doped SiO$_2$ k = 2.6 SiO$_2$ (C) A methyl doped silicon dioxide | | | | | |
| 3000 mT | ~80 sccm | 100 sccm | 500 sccm | 100 W | 0~25° C. |
| low-k N doped SiC k = 2.6 SiC (N) A methyl doped silicon carbide/nitride | | | | | |
| 1500 mT | ~80 sccm | nil | 50 sccm | 200 W | 0~25° C. |
| low-k C doped SiN k = 4.6 SiN (C) A methyl doped silicon nitride | | | | | |
| 500 mT | ~20 sccm | nil | 500 sccm | 1000 W | 0~25° C. |

It will thus be seen that at the particular nitrogen flow selected the low k nitrogen doped silicon carbide had a k value precisely equal to the low k carbon doped silicon dioxide formed as described above.

The RF power was applied by 380 Khz generator to the showerhead electrode and the platen was maintained at room temperature or below. Temperatures below 0° C. may be useful to the process, but in general the process has been run at room temperature or between 0° C. and room temperature.

Further experiments were carried out at 13.56 mHz RF power. It was found that the SiO$_2$(C) and SiC(N) results differed markedly. In the case of SiO$_2$(C) the deposition rate increased and the uniformity of thickness improved whereas for the SiC(N) material the rate decreased and the uniformity worsened. It is therefore further postulated that a low K etch stop layer of the invention could be formed from SiO$_2$(C) deposited at high frequency (above 4 mHz) and SiC(N) at low frequency (below 4 mHz).

The spacing of the wafer from the showerhead and the electrode will affect film uniformity and should be experimentally derived to maximise that uniformity. The flow rates for the tetramethylsilane (TMS) are approximate because they are difficult to determine for reasons given in our co-pending British Patent Application No. 9922691.2.

Initial experiments were carried out on silicon wafers without resist coating where, using the same etch process, the etch rates were:

| Film type | Precursors | Etch rate |
|---|---|---|
| SiO2 (C) | TMS/O2 | 9,377 Å/min |
| SIC (N) | TMS/N2 | 3,222 Å/min |
| SiN (C) | TMS/N2 | 4,787 Å/min |

From these etch rates one can calculate that there is an etch selectivity of 2.9:1 (SiO$_2$:SiC) which compares favourably to standard etch stop layers with much higher k values.

Thus, contrary to expectations, the nitrogen-doped SiC(N) material is preferable as a low k etch stop material to carbon-doped silicon nitride.

Stacked structures were then constructed using the deposition process essentially as set out above but including a hydrogen plasma treatment of the type disclosed in our co-pending British Patent Application No. 9922801.7 which is incorporated herein by reference. This hydrogen plasma treatment improves the low k film properties, e.g. reducing BOE wet etch rate from over 10,000 Å/min to the same order as that of a thermal oxide (about 550 Å/min), reducing hydrogen and carbon content, apparently increasing density and reducing the film's water absorption properties whilst reducing the likelihood of cracking.

The resultant stacks consisted of two 7000 Å layers of SiO$_2$(C) separated by a 500 Å layer of SiC(N). Each of the silicon dioxide layers had been hydrogen plasma treated.

Figure 2:
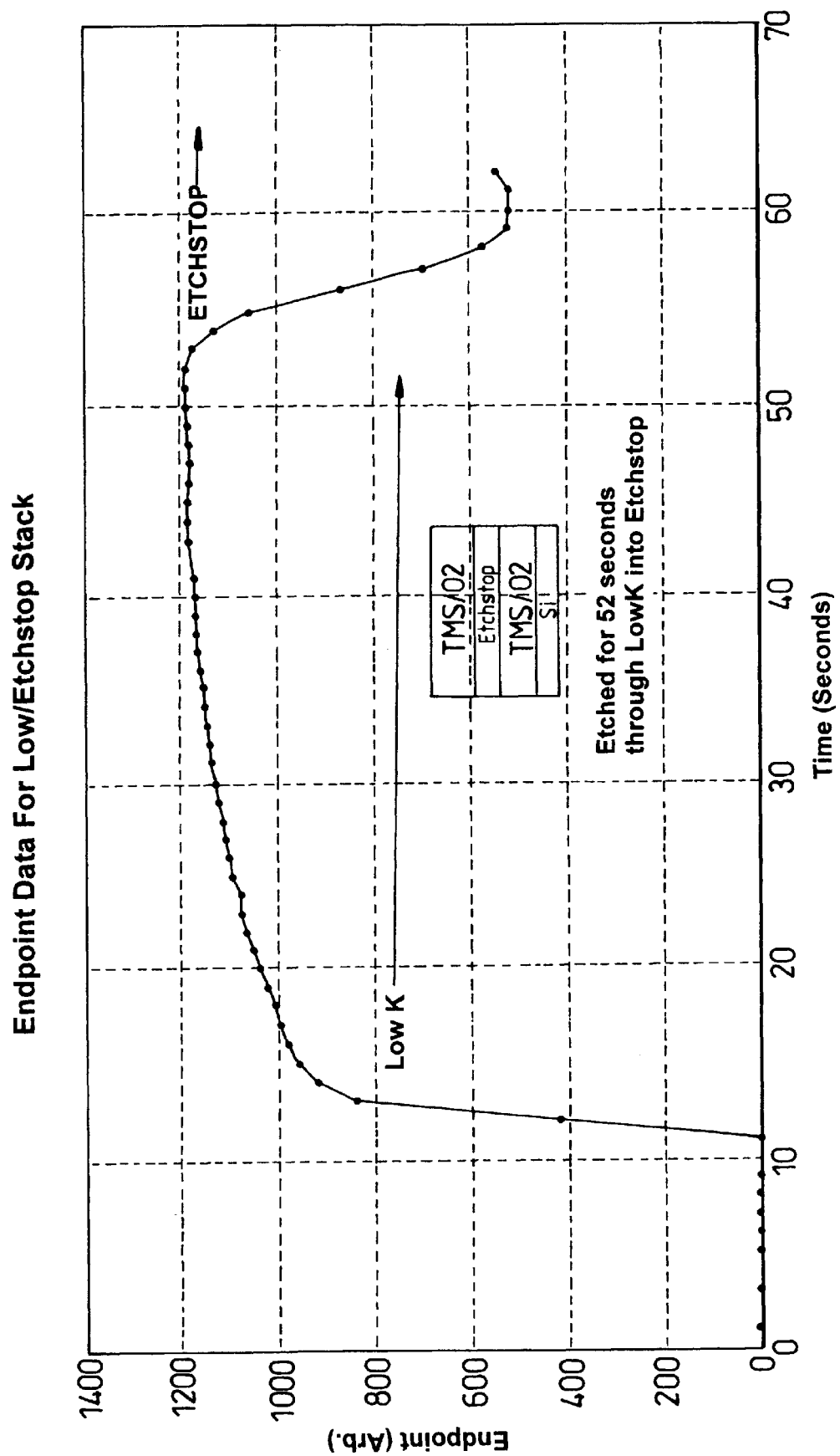
FIGS. 2, 3 and 4 are graphs illustrating the detectability of etch stop layers formed in accordance with the invention when located in the dielectric stack.
Figure 3:
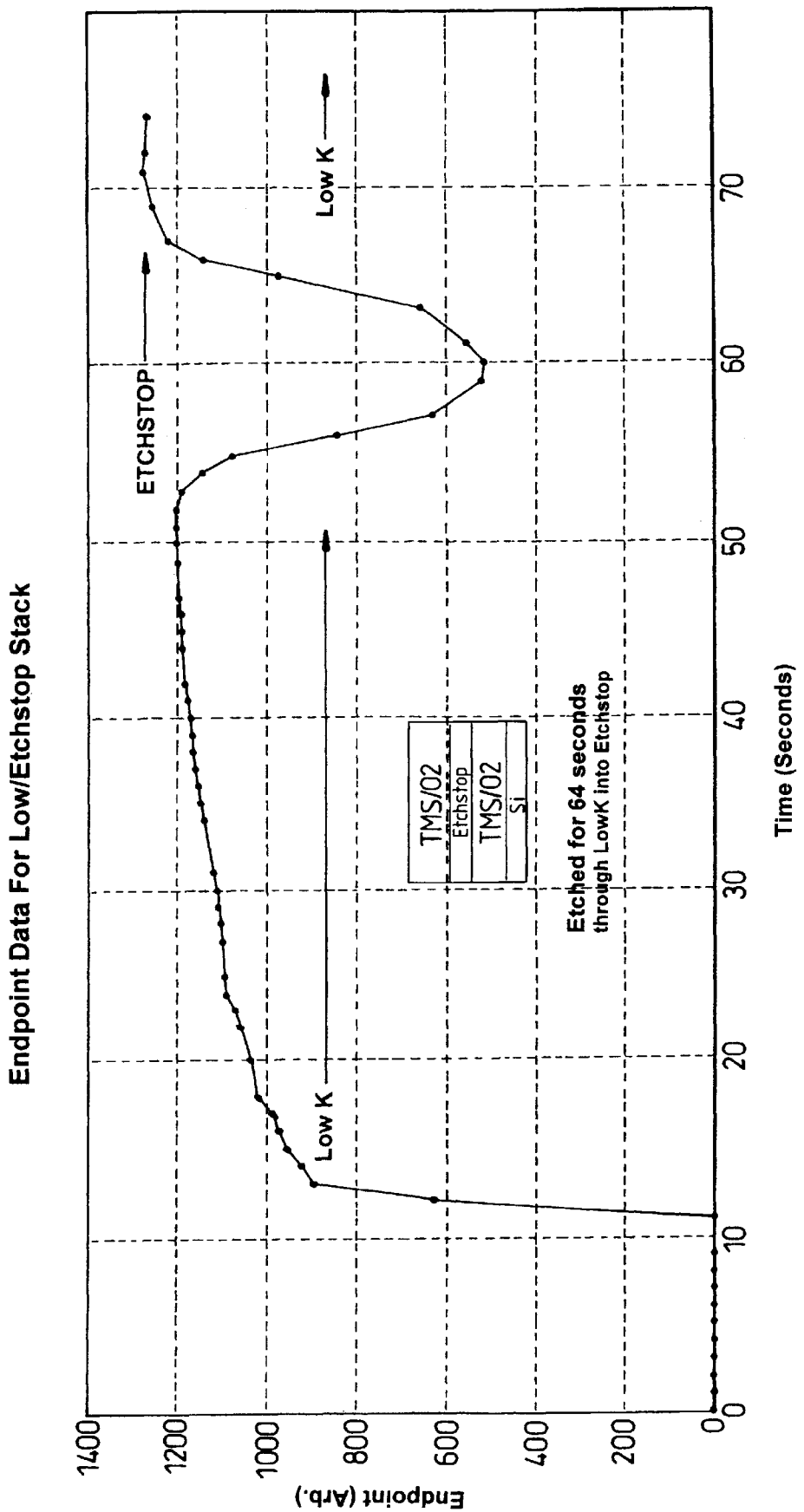

Etch experiments were run for different times and the output of an end point detector was recorded. As is commonly used for such experiments, the end point detector monitored the light intensity on the 440 nm emission line. The output from the end point detector is shown in FIGS. 2 and 3. (The vertical axis of FIGS. 3 to 4 indicate increasing signal intensity in arbitrary units).

Figure 4:
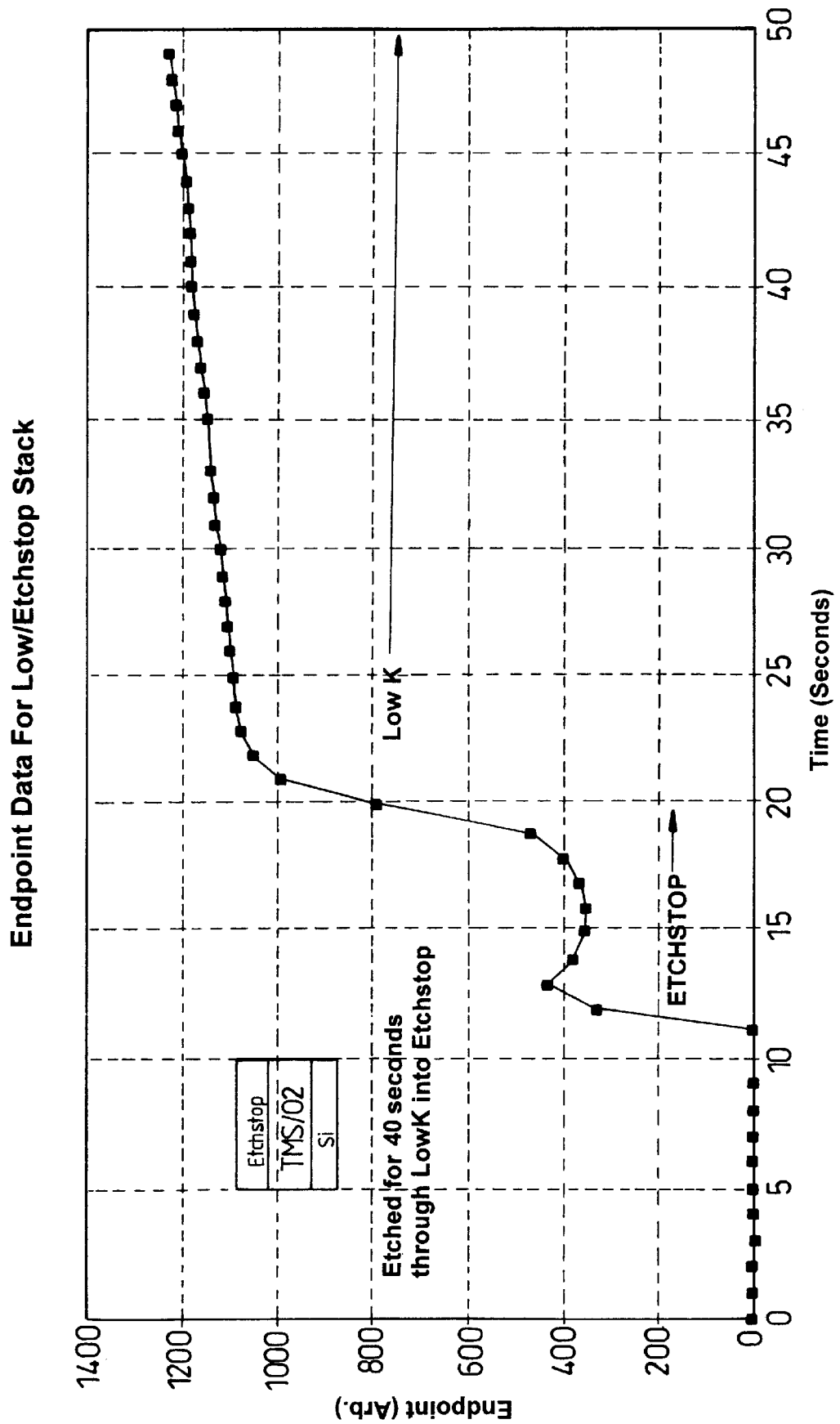

A further experiment was carried out with SiC(N) layer over SiO$_2$(C) layer and the end point signal output for this experiment is shown in FIG. 4.

Subsequently further experiments were carried out on patterned wafers. Two different patterns were used characterised, respectively, a small open area (as would be typical with a contact/via) and a large open area (which is comparable with to an interconnect). SiO$_2$(C), SiC(N) and SiN(C) materials as described above were used.

The results can be summarised as follows:

| Film type | Etch rate Å/min | Non uniformity +/– % | Selectivity to TMS/O2 SiO2 |
|---|---|---|---|
| | | Interconnect mask | |
| TMS/O2 SiO2 (C) | 10,611 | 8.3 | |
| TMS/N2 SiC type | 3,524 | 5.3 | 3.01 |
| TMS/N2 SiN type | 4,224 | 6.6 | |
| | | Contact/via mask | |
| TMS/O2 SiO2 (C) | 11,328 | 4.4 | |
| TMS/N2 SiC type | 3,875 | 5.9 | 2.92 |
| TMS/N2 SiN type | 3,932 | 9.0 | |

Thus it will be seen that, as well as having a much 30 higher k value, the etching characteristics of the SiN are inferior to those of the low k SiC material. Patterning or the absence of patterning does not make a significant difference to the selectivity of the low k $SiO_2(C)$ to the SiC(N). In the case where there was no photoresist the ratio was 2.9:1, whilst in these two experiments values of 3.01:1 and 2.92:1 were obtained giving an approximate value of 3:1. This etch selectivity combined with the very acceptable uniformity figures indicates that SiC(N) is a useful etch stop material and the figures indicate that end point signals of useful clarity are generated at the 440 nm line.

As has already been mentioned above, the SiC(N) material has desirable properties as a low k dielectric in its own right and this leads to the possibility of a two layer stack with no separate distinct "etch stop" layer. Indeed stacks can be built of layers of materials having similar k values but with sufficiently different etch characteristics that the transition between layers can be detected and automatic processing achieved.

A particular example of an application which can benefit from the use of two low k materials, without the use of an etch stop layer, is the formation of a low k bi-layer for dual damascene applications. Here one layer is used for the formation of vias, whilst the other defines the overlying trenches. As an example, a "trench first" scheme could use the faster etching $SiO_2(C)$ overlying slower etching layer in which the vias was formed. The trench pattern could be formed upon its surface by lithography and the trench pattern etched. An end point signal would be produced when the underlying material was reached and a timed over-etch carried out. Then the etch mask (e.g. a photoresist) would be removed and the wafer patterned for the underlying vias. The vias would then be etched in the underlying low-k layer.

An alternative procedure is illustrated in FIG. 5. As can be seen FIG. 5 illustrates at (a) to (e) a method of forming a wiring channel and via combination which utilises the differences in etch rate that can be obtained for the materials discussed above, whilst utilising their good low k characteristics. The method described is particularly advantageous in that it removes the need for lithography and mask formation for the vias at the bottom of the wiring channel. As the wiring becomes narrower and narrower the masking of the bottom of the channel becomes more and more challenging.

Figure 5A:
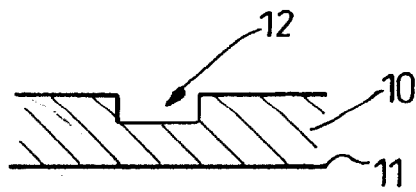
FIGS. 5(a) to (e) schematically illustrate the formation of a wiring channel and associated via.
Figure 5B:
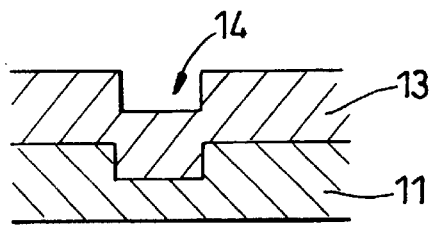
Figure 5C:
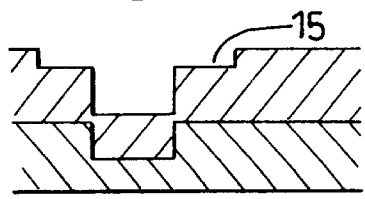
Figure 5D:
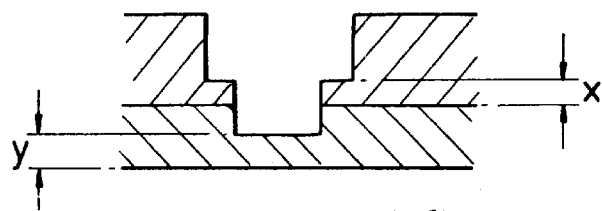
Figure 5E:
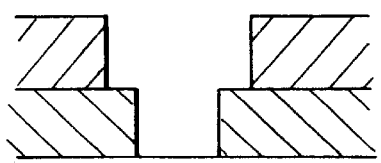

Thus in FIG. 5(a) a first layer of low k insulating material 10 is deposited on a substrate 11 and a via is part etched in the surface of that material as indicated at 12. At this time the etching of the via formation 11 is relatively straightforward because the whole surface of the layer 10 is exposed. In FIG. 5(b) a second conformal layer 13 is deposited so that it fills the formation 12 but this formation is then reflected at the surface of the layer 13 as shown at 14. The upper surface of 13 is then masked with the desired wiring pattern and FIG. 5(c) shows the part etching of the wiring channel 15. Simultaneously and inevitably the bottom of the formation 14 is also etched and so this progresses down into the formation 12 as shown at (c) and (d). At the point shown in (d) there will be a distance x left to etch in the layer 13, whereas there will be a distance y left to etch in the layer 11.

Although not clearly shown in the schematic drawings y will usually be greater than x and the ratio y/x will determine the relative etch rates which should be selected for the materials of the layers 13 and 11. In the kind of arrangement illustrated in the figures, it is likely that in fact that y will approximately be twice x and so the etch rate of material 11 should be twice that of material 13.

Material 11 can conveniently also provide the etch stop signal in the manner postulated above. Thus looking at the etch rates set out above, it will be seen that the carbon-doped silicon nitride and carbon-doped silicon dioxide provide an etch rate ratio or selectivity of approximately 2:1 whereas, as has been mentioned before, the selectivity of silicon dioxide to nitrogen-doped silicon carbide is approximately 3:1. Adjustment of doping can provide other selectivities.

What is claimed is:

1. A method of forming a low k film on a substrate comprising:
    (a) positioning the substrate on a support in a chamber;
    (b) supplying to the chamber in gaseous or vapour form a silicon- containing organic compound and nitrogen in the presence of a plasma to deposit a nitrogen-doped silicon carbide low k film on the substrate.

2. A method as claimed in claim 1 where the nitrogen-doped silicon carbide is deposited by a plasma driven at frequencies below 4 MHz.

3. A method as claimed in claim 1 wherein the silicon-containing organic compound is an alkylsilane.

4. A method as claimed in claims 1 wherein the silicon-containing compound is a tetraalkysilane.

5. A method as claimed in claims 1 wherein the silicon-containing organic compound is tetramethylsilane.

6. A method of forming a dual damascene structure including depositing a layer of first insulating material having a first etch rate on a semiconductor wafer, part etching one or more vias in the first layer, subsequentially depositing a layer of second insulating material onto the first so that the part etched via is filled with the second material causing a corresponding formation to appear at the surface of the second layer, etching the second layer a channel to receive a wiring line such that the channel contains the corresponding formation, the relative etch rates of the materials being such that when the channel is etched to the surface of the first layer, the via is fully etched through the first layer.

7. A method as claimed in claim 6 wherein the etch rate of the first layer is approximately twice that of the second layer.

8. A method as claimed in claim 6 wherein the first layer is carbon-doped $SiO_2$ and the second layer is nitrogen-doped SiC or carbon-doped silicon nitride.

9. A method of forming a low k etch stop layer comprising depositing carbon-doped $SiO_2$ by a plasma based reaction at a frequency above 4 MHz and depositing a nitrogen-doped SiC by a plasma based reaction onto the $SiO_2$ material at a frequency below 4 MHz.

* * * * *